United States Patent
Ballantine et al.

(10) Patent No.: US 6,271,054 B1
(45) Date of Patent: Aug. 7, 2001

(54) METHOD FOR REDUCING DARK CURRENT EFFECTS IN A CHARGE COUPLE DEVICE

(75) Inventors: Arne W. Ballantine, Cold Spring, NY (US); George A. Dunbar, III, Essex Junction, VT (US); James V. Hart, III, Barre, VT (US); Donna K. Johnson, Underhill, VT (US); Glenn C. MacDougall, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/586,500

(22) Filed: Jun. 2, 2000

(51) Int. Cl.⁷ .................................................. H01L 21/00
(52) U.S. Cl. .......................... 438/60; 438/775; 438/795; 438/66; 427/534; 427/579
(58) Field of Search .............................. 438/60, 795, 791, 438/792, 66, 775; 427/579, 69, 532, 534; 257/57, 297

(56) References Cited

U.S. PATENT DOCUMENTS

| | | | |
|---|---|---|---|
| 4,091,406 | 5/1978 | Lewis | 357/54 |
| 5,318,924 | 6/1994 | Lin et al. | 437/192 |
| 5,616,933 | * 4/1997 | Li | 257/57 |
| 5,620,906 | 4/1997 | Yamaguchi et al. | 438/162 |
| 5,707,895 | 1/1998 | Wuu et al. | 438/158 |
| 5,897,346 | 4/1999 | Yamaguchi et al. | 438/162 |
| 5,966,624 | * 10/1999 | Shen | 438/478 |

FOREIGN PATENT DOCUMENTS 6-132515 * 5/1994 (JP).

OTHER PUBLICATIONS

P.A. Tiner, et al., Extending the use of NO dielectrics for DRAM by ultrathin silicon nitride RTCVD, Rapid Thermal and Integrated Processing VI. Symp., pp. 387–92. (Abstract), Apr. 1997.*

* cited by examiner

Primary Examiner—Caridad Everhart
(74) Attorney, Agent, or Firm—Connolly Bove Lodge & Hutz; William D. Sabo

(57) ABSTRACT

The dark current defects in a charge couple device are reduced by employing a hydrogen anneal followed by depositing a silicon nitride barrier layer by RTCVD.

40 Claims, 1 Drawing Sheet

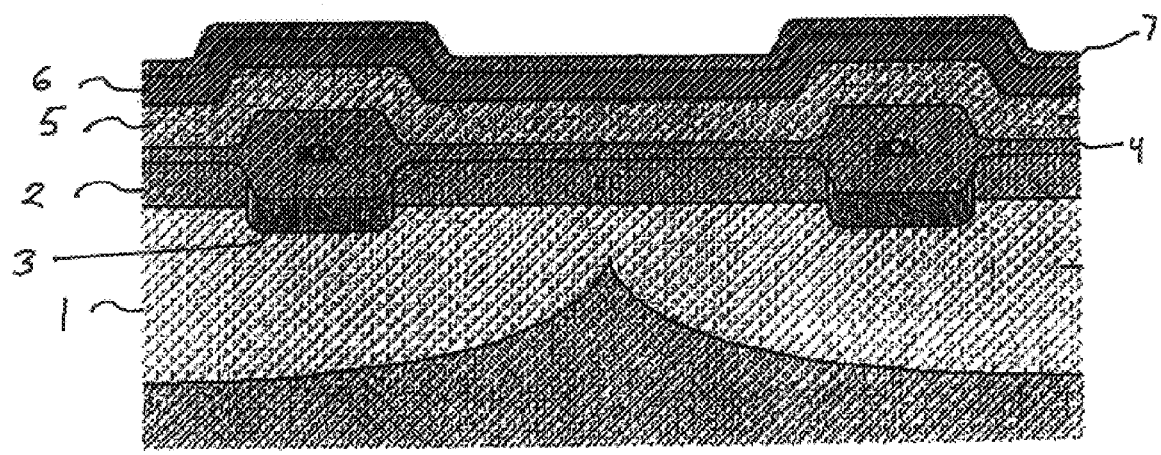

METHOD FOR REDUCING DARK CURRENT EFFECTS IN A CHARGE COUPLE DEVICE

TECHNICAL FIELD

The present invention relates to a method for significantly reducing, if not eliminating, the dark current effects in a charge couple device (CCD). More particularly, the present invention involves a combination of a hydrogen anneal followed by depositing a hydrogen-rich barrier layer of silicon nitride by rapid thermal chemical vapor deposition (RTCVD). In addition, the present invention relates to charge couple devices obtained according to the process of the present invention. The process of the present invention makes it possible to achieve active storage area dark currents of less than 250 picoamps/cm$^2$ on full frame, progressive scan CCD image sensors incorporating vertical anti-blooming device structures.

BACKGROUND OF INVENTION

A charge couple device (CCD) functions as an active matrix to absorb light and convert it to electrons. Such are used for example as the electronic film in digital still cameras(DSC).

Desirably, a charge couple device should absorb as much light as possible while, at the same time, minimizing leakage between pixels as much as possible.

A particularly perplexing problem of charge couple devices is referred to as dark current. Dark current is the undesired (noise/leakage) current which flows when no light is presented to the CCD array. Excessive dark current destroys the dynamic range of the CCD array when there is insufficient ability to distinguish between light and dark conditions.

The problem concerning dark current defects is especially critical in consumer digital still picture applications where cameras must function in both bright (short shutter speed) and low (long shutter speed) light conditions. This is typically not a factor in commercial (i.e. professional) in a studio setting.

It is known that hydrogen present in the CCD device will reduce dark current by passivating dangling bonds. However, while hydrogen could be used to solve the problem, keeping the hydrogen in the device is problematic since hydrogen diffuses very readily.

Attempts to prevent hydrogen diffusion have involved certain nitride films. For example, work on hot-electron effect mitigation with deuterium has shown that a barrier nitride layer limits loss of deuterium (D-2) from CMOS devices. Further, for solving this problem in CMOS devices, deposited nitride films containing some amount of hydrogen, trapped during the deposition process have been suggested. This hydrogen, in addition to any hydrogen annealed in before a barrier nitride deposition, acts as a hydrogen reservoir.

However, barrier nitride films suggested in the prior art are from plasma enhanced chemical vapor deposition (PECVD) or furnace low pressure chemical vapor deposition (LPCVD). In the case of a CCD device, neither of these process solutions is workable. PECVD films are too high in stress with the addition of sufficient hydrogen. While they prevent hydrogen diffusion which would limit dark current, their higher stress levels create dark current via a stress mechanism.

In addition, an attempt with a relatively thick (e.g. 1750 angstroms) hydrogen enriched PECVD reduced dark current, but the thickness of the film actually destroyed the necessary light transmissivity of the array. On the other hand, use of a relatively thin (e.g. 300 angstroms) hydrogen enriched PECVD nitride film had undesirable stress characteristics but adequate light transmissivity.

Furthermore, LPCVD films by comparison are very low in hydrogen content and also create integration problems due to the long heat cycle. Therefore, they are unable to provide a sufficient hydrogen reservoir. Additionally, the use of LPCVD barrier nitride adds a substantial thermal cycle which can change dopant profiles and allow for dopant deactivation.

Accordingly, a need exists to address the dark current problem of charge couple devices.

SUMMARY OF INVENTION

The present invention overcomes problems of the prior art and provides for trapping hydrogen on the surface of the cell to minimize leakage from pixel to pixel and still permit the absorption of sufficient light. The present invention provides for at least significantly reducing the dark current effects in a charge couple device. In fact, the present invention makes it possible to achieve active storage area dark currents of less than 250 picoamps/cm$^2$ on full frame, progressive scan CCD image sensors incorporating vertical anti-blooming device structures.

More particularly, the process of the present invention relates to reducing dark current defects in a charge couple device which comprises:

a) subjecting the charge couple device to an anneal in hydrogen at a temperature of about 850° C. to about 950° C. for at least 20 minutes; and b) then depositing a barrier layer of silicon nitride by RTCVD to a thickness of about 250 to about 350 angstroms.

The present invention also relates to a charge couple device obtained by the above process.

Still other objects and advantages of the present invention will become readily apparent by those skilled in the art from the following detailed description, wherein it is shown and described preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

SUMMARY OF DRAWING

The FIGURE is a schematic cross-sectional view of a CCD array according to the present invention.

BEST AND VARIOUS MODES FOR CARRYING OUT INVENTION

In order to facilitate an understanding of the present invention, reference will be made to the FIGURE. In particular, numeral 1 illustrates a p-well for collecting charge as present in a conventional CCD array. Numeral 2 represents a typical buried channel and 3 illustrates a typical channel stop. The thermally grown oxide 4 acts as a barrier between pixels and 5 is typically a doped polycrystalline silicon layer which functions to carry the charge generated by the light.

Also present is layer 6 which is typically an oxidized polycrystalline silicon layer. Layer 6 acts to reduce capacitance to other passing polycrystalline silicon layers. The layers 1–6 and methods for their fabrication are well known in the art and need not be described in any further detail herein.

According to the present invention, a hydrogen-enriched silicon nitride film 7 is deposited on top of barrier layer 6. Prior to depositing the nitride film 7 the charge couple device is subjected to an anneal in hydrogen gas. The temperature of the anneal is preferably about 850° C. to about 950° C. and most preferably about 925° C. The anneal is carried out for at least about 20 minutes.

The pressure of the anneal is typically about 100 torr to about 800 torr, and more typically about 140 torr to about 160 torr, a particular example being about 152 torr.

The flow rate of the $H_2$ is typically about 100 l/min to about 250 l/min, and more typically about 110 l/min to about 130 l/min, an example being about 120 slm (standard liters/minute).

The following table illustrates an example of an anneal according to the present invention.

|  | Step 1 | Step 2 | Step 3 | Step 4 |
|---|---|---|---|---|
| Time (sec) | 5 | 300 | 1200 | 5 |
| Temperature (C.) | 875 | 925 | 925 | 650 |
| Pressure (torr) | 152 | 152 | 152 | 760 |
| $H_2$ Flow (slm) | 120 | 120 | 120 | 120 |

Step 2 above starts with a 240 second controlled temperature range from 875° C. to about 925° C. Following the anneal, the nitride barrier layer 7 such as silicon nitride is deposited by rapid thermal chemical vapor deposition (RTCVD). The RTCVD is typically carried out at temperatures of about 650° C. to about 850° C., an example being about 775° C. and pressures of about 25 torr to about 1220 torr, an example being about 100 torr.

The deposition takes place on the structure while rotating to assure even distribution of the layer 7. Typical rotation speeds are about 30 rpm to about 45 rpm, an example being about 35 rpm.

Silicon nitride can be obtained by employing a silicon containing gas such as silane ($SiH_4$), disilane, trisilane, tetrasilane, dichlorosilane, and trichlorosilane and a nitrogen containing gas such as $NH_3$. In addition, deuterated forms of these gases where deuterium replaces hydrogen can be used.

The ratio of the silicon containing gas to nitrogen containing gas is typically about 1:25 to about 1:400, more typically about 1:50 to about 1:200, an example being about $1(SiH_4):100(NH_3)$.

The deposition is typically carried out for about 5 to about 120 seconds, and more typically about 20 to about 40 seconds to provide a thickness of about 250 angstroms to about 350 angstroms, an example being about 300 angstroms.

The deposition process also preferably includes a prepurge in $H_2$ carrier gas at a flow rate of about 1 to about 10 l/min, and typically for about 25 seconds to about 35 seconds, an example being about 30 seconds.

This prepurge can be followed by a nucleation step by introducing $NH_3$ typically at a flow rate of about 1 to about 10 l/min for about 10 seconds to about 60 seconds, an example being about 12 seconds. Next, a stabilizer flow of $SiH_4$ gas at a flow rate of about 10 l/min to about 80 l/min for about 10 to about 60 seconds, an example being about 15 seconds, can be carried out.

This is followed by the flow of the $SiH_3/NH_3$ as discussed above. For a 300 angstrom thickness the time of the flow is about 26 seconds.

After the deposition, a purge in $NH_3$ can be employed. This is usually carried out employing a flow rate of about 1 l/min to about 10 l/min for about 10 seconds to about 60 seconds, an example being about 15 seconds. Next, a purge in $N_2$ can be carried out which typically employs a flow rate of about 1 l/min to about 10 l/min for about 5 seconds to about 20 seconds, an example being 10 seconds.

The following illustrates a preferred H-rich RTCVD nitride deposition sequence according to the present invention.

Pressure—100 T, Temperature—775° C., Rotation—35 rpm, Flows—1:100 ($SiH_4:NH_3$)

Pre-purge in $H_2$ carrier gas 30 sec;

Nucleate in $NH_3$ 12 sec;

Stabilize $SiH_4$ flow 15 sec;

Deposit to thickness target (350 angstroms=26 sec);

Purge $NH_3$ 15 sec;

$N_2$ purge 10 sec.

Employing the four step anneal described in detail above, along with the above preferred H-rich RTCVD silicon nitride deposition sequence, results in active storage area dark currents of 225 to less than 250 picoamps/cm$^2$ on the particular CCD described herein. The active area (light collection area) dark current is most significant when correlating performance to spec. It is the highest value and the one more commonly referred to when describing the effectiveness of the CCD under low light conditions.

The present invention provides for a high —H concentration and low stress layer along with a low thermal budget.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method for reducing dark current defects in a charge couple device which comprises:

a) subjecting the charge couple device to an anneal in hydrogen at a temperature of about 850° C. to about 950° C. for at least 20 minutes; and wherein the anneal is carried out at a pressure of about 100 torr to about 800 torr; and b) then depositing a barrier layer of silicon nitride by RTCVD to a thickness of about 250 to about 350 angstroms.

2. The method of claim 1 wherein the temperature is about 925° C.

3. The method of claim 1 wherein the anneal is carried out at a pressure of about 152 torr.

4. The method of claim 1 wherein the anneal is carried out employing a $H_2$ flow rate of about 100 l/min to about 25 l/min.

5. The method of claim 1 wherein the anneal is carried out employing a $H_2$ flow rate of about 120 slm.

6. The method of claim 1 wherein the thickness of the barrier layer is about 300 angstroms.

7. The method of claim 1 wherein the thickness of the barrier layer is about 300 angstroms.

8. The method of claim 1 wherein the RTCVD is carried out at a temperature of about 650 to about 850° C.

9. The method of claim 1 wherein the RTCVD is carried out at a temperature of about 775° C.

10. The method of claim 1 wherein the RTCVD is carried out at a pressure of about 25 to about 120 torr.

11. The method of claim 1 wherein the RTCVD is carried out at a pressure of about 100 torr.

12. The method of claim 1 wherein the RTCVD is carried out while the device is rotated at a speed of about 30 to about 45 rpm.

13. The method of claim 1 wherein the RTCVD is carried out while the device is rotated at a speed of about 35 rpm.

14. The method of claim 1 wherein the RTCVD is carried out employing $SiH_4$.

15. The method of claim 14 wherein the ratio of $SiH_4:NH_3$ is about 1:100, and $NH_3$.

16. The method of claim 1 wherein the RTCVD is carried out for about 5 to about 120 seconds.

17. The method of claim 1 which further includes as prepurge in $H_2$ followed by nucleation in $NH_3$ prior to the RTCVD and a purge in $NH_3$ and a purge in Nz after the RTCVD.

18. The method of claim 1 wherein the charge couple device comprises a P-well buried channel, channel stop, thermally grown oxide barrier, a doped polycrystalline silicon layer and an oxidized polycrystalline silicon barrier layer.

19. A method for reducing dark current defects in a charge couple device which comprises:
   a) subjecting the charge couple device to an anneal in hydrogen at a temperature of about 850° C. to about 950° C. for at least 20 minutes; and
   b) then depositing a barrier layer of silicon nitride by RTCVD to a thickness of about 250 to about 350 angstroms; wherein the RTCVD is carried out at a temperature of about 650 to about 850° C.

20. The method of claim 19 wherein the temperature is about 925° C.

21. The method of claim 19 wherein the anneal is carried out at a pressure of about 152 torr.

22. The method of claim 19 wherein the anneal is carried out employing a $H_2$ flow rate of about 100 l/min to about 25 l/min.

23. The method of claim 19 wherein the anneal is carried out employing a $H_2$ flow rate of about 120 slm.

24. The method of claim 19 wherein the thickness of the barrier layer is about 300 angstroms.

25. The method of claim 19 wherein the thickness of the barrier layer is about 300 angstroms.

26. The method of claim 19 wherein the RTCVD is carried out at a temperature of about 775° C.

27. The method of claim 19 wherein the RTCVD is carried out at a pressure of about 25 to about 120 torr.

28. The method of claim 19 wherein the RTCVD is carried out at a pressure of about 100 torr.

29. The method of claim 19 wherein the RTCVD is carried out while the device is rotated at a speed of about 30 to about 45 rpm.

30. The method of claim 19 wherein the RTCVD is carried out while the device is rotated at a speed of about 35 rpm.

31. The method of claim 19 wherein the RTCVD is carried out employing $SiH_4$.

32. The method of claim 31 wherein the ratio of $SiH_4:NH_3$ is about 1:100, and $NH_3$.

33. The method of claim 19 wherein the RTCVD is carried out for about 5 to about 120 seconds.

34. The method of claim 19 which further includes as prepurge in $H_2$ followed by nucleation in $NH_3$ prior to the RTCVD and a purge in $NH_3$ and a purge in Nz after the RTCVD.

35. The method of claim 19 wherein the charge couple device comprises a P-well buried channel, channel stop, thermally grown oxide barrier, a doped polycrystalline silicon layer and an oxidized polycrystalline silicon barrier layer.

36. A method for reducing dark current defects in a charge couple device which comprises:
   a) subjecting the charge couple device to an anneal in hydrogen at a temperature of about 850° C. to about 950° C. for at least 20 minutes; and
   b) then depositing a barrier layer of silicon nitride by RTCVD to a thickness of about 250 to about 350 angstroms; and
      wherein the RTCVD is carried out at a pressure of about 25 to about 120 torr.

37. A method for reducing dark current defects in a charge couple device which comprises:
   a) subjecting the charge couple device to an anneal in hydrogen at a temperature of about 850° C. to about 950° C. for at least 20 minutes; and
   b) then depositing a barrier layer of silicon nitride by RTCVD to a thickness of about 250 to about 350 angstroms; and
      wherein the RTCVD is carried out while the device is rotated at a speed of about 30 to about 45 rpm.

38. A method for reducing dark current defects in a charge couple device which comprises:
   a) subjecting the charge couple device to an anneal in hydrogen at a temperature of about 850° C. to about 950° C. for at least 20 minutes; and
   b) then depositing a barrier layer of silicon nitride by RTCVD to a thickness of about 250 to about 350 angstroms; and
      wherein the RTCVD is carried out employing $SiH_4$ and $NH_3$.

39. A method for reducing dark current defects in a charge couple device which comprises:
   a) subjecting the charge couple device to an anneal in hydrogen at a temperature of about 850° C. to about 950° C. for at least 20 minutes; and
   b) then depositing a barrier layer of silicon nitride by RTCVD to a thickness of about 250 to about 350 angstroms;
      and which further includes a prepurge in $H_2$ followed by nucleation in $NH_3$ prior to the RTCVD and a purge in $NH_3$ and a purge in $N_2$ after the RTCVD.

40. A method for reducing dark current defects in a charge couple device which comprises:

a) subjecting the charge couple device to an anneal in hydrogen at a temperature of about 850° C. to about 950° C. for at least 20 minutes; and b) then depositing a barrier layer of silicon nitride by RTCVD to a thickness of about 250 to about 350 angstroms; and wherein the charge couple device comprises a P-well buried channel, channel stop, thermally grown oxide barrier, a doped polycrystalline silicon layer and oxidized polycrystalline silicon barrier layer.

* * * * *

UNITED STATES PATENT AND TRADEMARK OFFICE
CERTIFICATE OF CORRECTION

PATENT NO.    : 6,271,054 B1
DATED         : August 7, 2001
INVENTOR(S)   : Arne W. Ballantine et al.

It is certified that error appears in the above-identified patent and that said Letters Patent is hereby corrected as shown below:

Column 5,
Line 28, after "$SiH_4$" insert -- and $NH_3$ --.
Line 30, delete ", and $NH_3$".
Line 35, change "Nz" to -- $N_2$ --.

Column 6,
Line 10, after "$SiH_4$" insert -- and $NH_3$ --.
Line 12, delete ", and $NH_3$".
Line 17, change "Nz" to -- $N_2$ --.

Signed and Sealed this

Eleventh Day of June, 2002

*Attest:*

*Attesting Officer*

JAMES E. ROGAN
*Director of the United States Patent and Trademark Office*